United States Patent [19]

Koskinen

[11] Patent Number: 4,615,041
[45] Date of Patent: Sep. 30, 1986

[54] ADAPTIVELY TUNED CLOCK RECOVERY CIRCUIT

[75] Inventor: Leslie M. Koskinen, Aylmer, Canada

[73] Assignee: Northern Telecom Limited, Montreal, Canada

[21] Appl. No.: 633,612

[22] Filed: Jul. 23, 1984

[51] Int. Cl.⁴ .............................................. H04L 7/02
[52] U.S. Cl. .................................... 375/114; 307/511; 328/155; 375/119
[58] Field of Search ................ 375/106, 97, 114, 110, 375/113, 118, 119; 455/67, 71, 151, 226; 179/170 A; 324/57 Q; 307/511, 520, 521, 527, 528; 328/113, 167, 155, 223; 333/17 R

[56] References Cited

U.S. PATENT DOCUMENTS

| 2,957,045 | 10/1960 | Perry, Jr. | 375/119 |
| 3,010,073 | 11/1961 | Melas | 375/110 |
| 3,143,666 | 8/1964 | Aaronson | 307/511 |
| 3,368,037 | 2/1968 | MacGregor | 375/119 |
| 3,593,167 | 7/1971 | Koulopoulos | 328/155 |
| 3,624,521 | 11/1971 | Dellicicchi | 328/155 |
| 4,059,812 | 11/1977 | Procter | 375/118 |
| 4,453,145 | 6/1984 | Schuster | 333/174 |
| 4,545,061 | 10/1985 | Hileman | 375/119 |

Primary Examiner—Marc E. Bookbinder
Attorney, Agent, or Firm—R. John Haley

[57] ABSTRACT

An adaptively tuned clock recovery circuit suitable for digroup terminal equipment comprises a reference pattern generator which generates two ones followed by fourteen zeros generated at the transmit clock rate. The pattern is applied to a tunable resonant circuit in the receive clock recovery circuit and the phase-difference between the free oscillations of the resonant circuit during the fourteen zeros and the transmit clock is detected. The resonant circuit frequency is automatically altered by switching capacitor in or out until the phase-difference is diminished to a predetermined value, whereupon the tuning process stops and the equipment is returned to normal operation.

14 Claims, 5 Drawing Figures

ADAPTIVELY TUNED CLOCK RECOVERY CIRCUIT

FIELD OF THE INVENTION

The present invention is directed to clock recovery circuits for the recovery of the timing clock from a received digital data stream. More particularly the invention is directed to an adaptive clock recovery circuit for use in digital terminal equipment in switching offices or the like. More particularly still, it is directed to clock recovery in the 1.544 MHz digital terminations in so called digroup terminal equipment.

BACKGROUND OF THE INVENTION

In the widely used T1 and similar trunking systems digital data is transmitted between switching offices at the rate of 1.544 MHz for transmission of PCM encoded voice and data. As in all similar data transmission systems, a clock signal must be recovered from the received data stream in order to regenerate and strobe the incoming digital pulses, degraded by the transmission path, prior to actual processing, switching or rerouting. Normally, the incoming digital cable terminates in an office repeater located in the switching office of the telephone company and which is adjusted to match the final stretch of unrepeatered transmission line.

While the office repeater delivers a regenerated data stream, it is still necessary to supply the receive section with both the incoming data stream and a separate stable and continuous clocking signal extracted from the data stream and coherent therewith. The equipment that performs this, among other functions, is generally known as the digital termination and, in the context of the 1.544 MHz transmission systems, as the digroup terminal equipment. The popular 1.544 MHz systems accommodate 24 voice channels, hence the term digroup, a group being 12 voice channels.

In the digroup terminal equipment a receive amplifier is followed by a clock recovery circuit which normally consists of some type of tuned circuit (an electronic fly-wheel) having a pass band centered around 1.544 MHz and having a sufficiently high quality factor Q. As the incoming digital data pulses excite the tuned circuit they cause it to "ring" due to its high Q and produce an oscillatory output even though the excitation may have ceased for a few clock durations during the transmission of zeros. Given the practical limitations of actual tuned circuits, it is necessary to excite a clock recovery circuit for at least once every sixteen clock periods in a 1.544 MHz system. Accordingly, the coding standards for such transmission systems call for a maximum of fifteen consecutive zeros in the transmitted data stream in order to maintain synchronization at all times.

The tuned circuit itself must have a minimum Q factor which also determines the resulting bandwidth, thereby defining the necessary center frequency accuracy of the circuit. The higher the Q (necessary for longer "ringing"), the narrower is the bandwidth and the more accurately must the circuit be tuned. In practical terms, it is necessary that the frequency determining components of the tuned circuit must have a tolerance below 1% over both life and temperature range of the circuit. This tolerance requirement is too stringent for practical components and devices and as a result the tuning circuit must be tuned and possibly retuned manually to the centre frequency. The initial tuning is normally done during production testing, with readjustment in the field if necessary.

SUMMARY OF THE INVENTION

The present invention endeavours to obviate the adjusting and readjusting of tuning circuits in clock recovery circuits manually.

Accordingly, it is an object of the present invention to provide an automatically tuned clock recovery circuit.

A further object is to provide an adaptively tuned clock recovery circuit in digital terminal equipment, and in particular in digroup and similar terminal equipment.

In order to accomplish these objects, the present invention provides a clock recovery circuit that adaptively responds to periodic reference or test patterns of digital data by altering its centre (tuned) frequency to minimize the phase difference between its free running (ringing) oscillations and the clock signal of the reference pattern, thereby minimizing the difference between its centre frequency and the clock signal frequency.

As is well known to those skilled in the art, a free running tuning ("tank") circuit if excited by an impulse would ring, i.e. continue to oscillate, with diminishing amplitude at its own tuned (natural) frequency after cessation of excitation. If the excitation impulse itself is periodic and subject to a master clock of a frequency close to that of the tuning circuit, then the difference in frequency between the clock and the ringing oscillations would also be observable as a phase difference between the two. The phase difference is sensed and if it exceeds a predetermined value capacitance is added to, or extracted from, the tuning circuit until its natural frequency is sufficiently close to that of the master clock of the exciting pulse (or pulse pattern). The reference or test pulse pattern is then removed, and the tuning circuit receives the actual data stream.

Accordingly, the present invention provides an adaptively tuned clock recovery circuit for recovering a clock signal from an incoming digital data stream comprising: a pattern generator for supplying a periodic reference data pattern at a local clock rate; a tunable resonant circuit having an initial resonant frequency in the vicinity of the local clock rate and excited by said reference data pattern; a bistable phase discriminator for indicating that a predetermined phase-difference between said local clock and free oscillations of said tunable resonant circuit has been exceeded; and control means responsive to said bistable phase discriminator for varying said initial resonant frequency toward said local clock rate until said predetermined phase-difference is no longer being exceeded.

BRIEF DESCRIPTION OF THE DRAWINGS

The preferred embodiment of the present invention will now be described in conjunction with the attached drawings, in which.

DESCRIPTION OF THE PREFERRED EMBODIMENT

Figure 1:
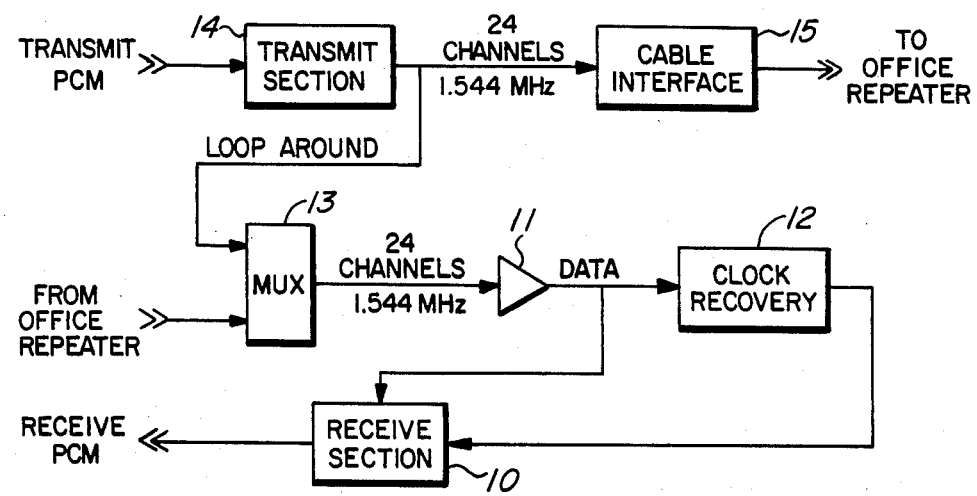
FIG. 1 is a block diagram of the relevant section of prior art systems.

Referring to FIG. 1 of the drawings, the prior art digroup terminal equipment comprises a receive section 10, which receives the receive data from receive amplifier 11 as well as the therefrom recovered clock extracted by a clock recovery circuit 12, and which outputs the receive PCM to the remainder of the system, be it a channel bank, a digital switch or the like. The receive amplifier 11 normally receives the incoming data stream supplied by an office repeater (not shown) via a multiplexer 13, which also enables a loop around from the transmit section 14 of the system for testing purposes. The transmit data stream from the transmit section 14 is applied to a cable interface 15 which feeds the same office repeater just mentioned. The clock recovery circuit 12 is a conventional circuit having a tuning or tank circuit that is tuned and readjusted manually in the field if necessary followed by an amplifier. Normally, the tank circuit is tuned by moving a ferrite slug inside the core of its inductor and observing the resonant frequency with external test equipment.

Figure 2:
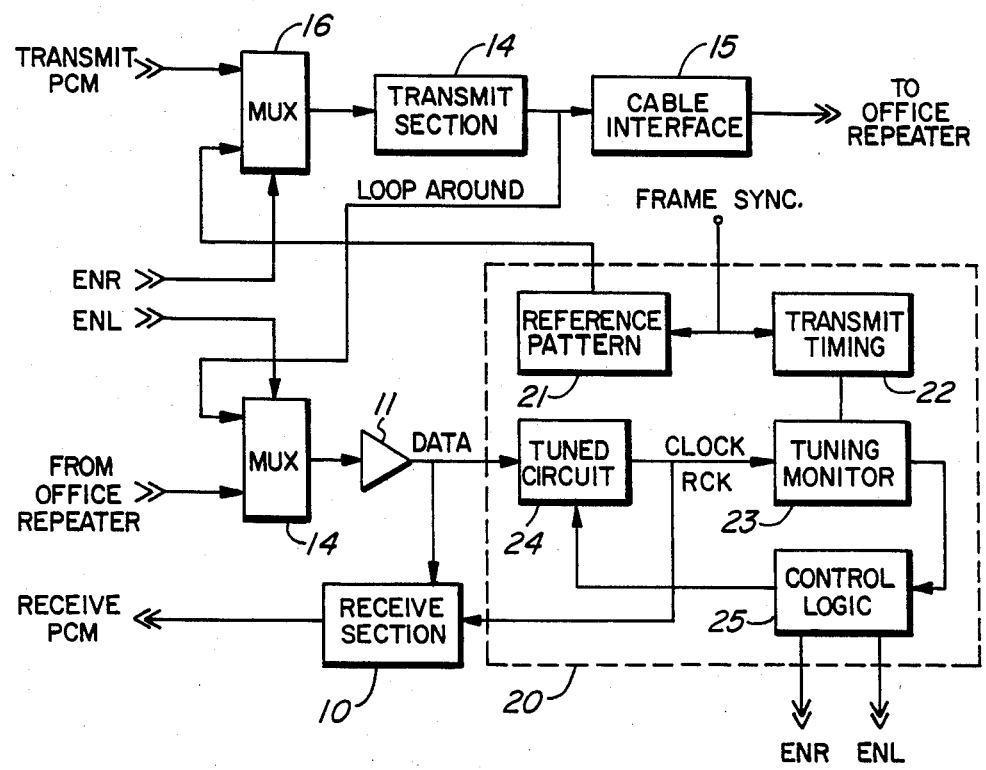
FIG. 2 is a block diagram of the section shown in FIG. 1 incorporating the circuit of the present invention.

Turning now to FIG. 2, it shows the basic system as shown in FIG. 1 but incorporating an adaptive clock recovery circuit 20 in place of the clock recovery circuit 12. In addition, a second multiplexer 16 is necessary in order to enable the application of a periodic reference pattern to the transmit section 14 instead of the transmit PCM during the automatic, adaptive tuning of the adaptive clock recovery circuit 20. The adaptive clock recovery circuit 20 itself comprises a periodic reference pattern generator 21 the output of which is applied to the multiplexer 16, a transmit timing unit 22 which initializes a tuning monitor 23 to begin the adaptive tuning process. The tuning monitor determines whether a tuned circuit 24 is or is not in tune and if it is not initializes a control logic 25 to switch the multiplexers 13 and 16 to loop around and to deliver the periodic reference pattern, respectively, and to alter the tuning of the tuned circuit 24 until the tuning monitor 23 indicates that it is in tune, upon which the multiplexers 13 and 16 return to their normal operating position and the tuning stops.

Figure 3:
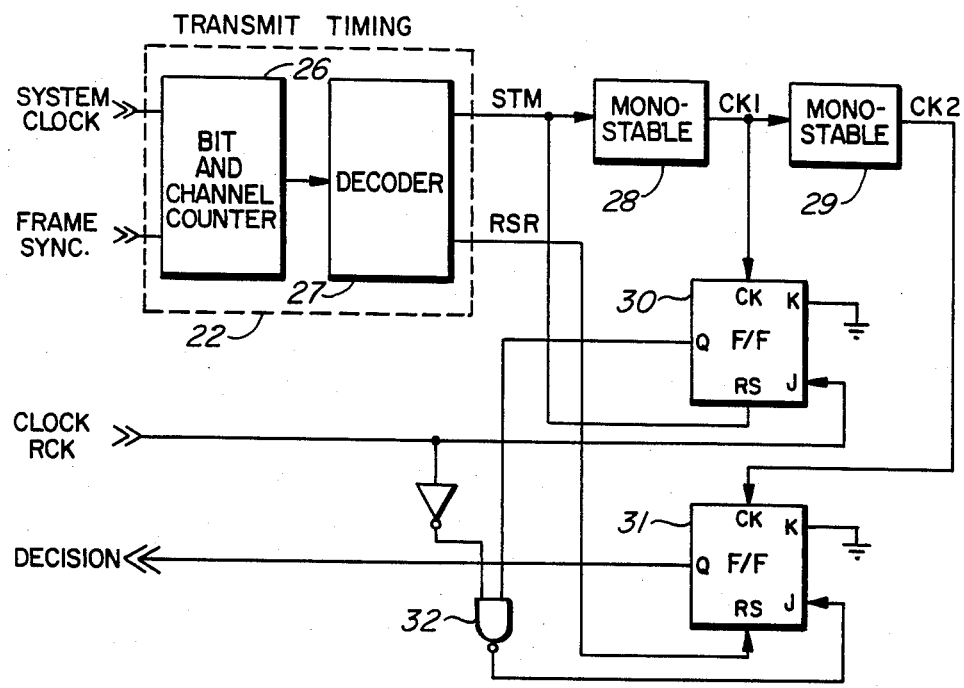
FIG. 3 is a more detailed circuit block diagram of two blocks in the circuit shown in FIG. 2.

FIG. 3 shows the transmit timing unit 22 and the tuning monitor 23 in more detail. Basically, the transmit timing unit 22 comprises a bit and channel counter 26 driven by the transmit system clock and the frame synchronization pulse. Two states of the counter 26 are decoded by a decoder 27 in order to start and reset the tuning monitor 23, which comprises a first mono-stable 28 initialized by a start signal from the decoder 27 and which itself initializes a second mono-stable 29. The mono-stables 28 and 29 generate two timing references CK1 and CK2, respectively, which clock two J-K flip-flops 30 and 31, respectively. The Q output of the flip-flop 30 is applied to one of two inputs of an NAND gate 32, while its other input receives the inverted clock RCK (receive clock) output by the tuned circuit 24, which RCK is also applied to the J terminal of the flip-flop 30. The J terminal of the flip-flop 31 receives the output of the NAND gate 32. The K terminals of both the flip-flops 30 and 31 are at ground. The Q output of the flip-flop 31 is the decision output of the tuning monitor 23 and, as will be seen later, indicates that the tuned circuit 24 is in tune when it is low (logical zero) while the periodic reference is present.

Figure 4:
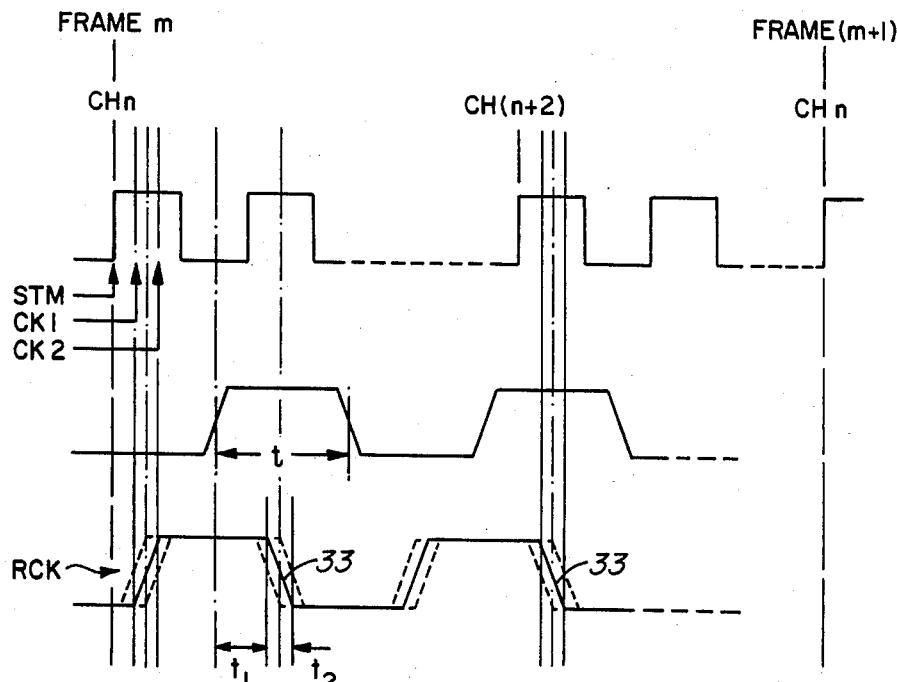
FIG. 4 is pulse patterns occurring in the circuit of FIG. 3.

Before going on to describe the actual tuning circuit shown in FIG. 5, the principle of operation of the system will be described with reference to FIG. 4. The top pulse sequence in FIG. 4 depicts the periodic reference pattern which consists of 2 ones followed by 14 zeros, and thus occupies two channels, each channel being eight bits. The reference pattern, therefore, repeats itself twelve times every single frame in the 24 channel digroup system under consideration. As the tuned circuit 24 is stimulated (excited) by the periodic reference pattern, which is itself generated at the desired rate of 1.544 MHz, its output clock shown at the bottom of FIG. 4 would have its falling edges 33 occur at the centre of the data pulse interval (or bit cell) t only if the tuned circuit 24 was in tune, i.e. if its natural frequency coincides with that of the clock frequency of the reference pattern 1.544 MHz. If, however, the tuned circuit 24 is out of tune, i.e. its centre or natural frequency differs from 1.544 MHz, the falling edges 33 will not consistently occur at the centre of the bit cell period t. The reason being that the slight difference in the natural frequency of the tuned circuit 24, at which it runs freely during the 14 zeros period in the reference pattern, manifests itself as a slight difference in phase as indicated in FIG. 4 by the dotted rising and falling edges. It is assumed here that the tuned circuit 24 will not be out of tune by more than one part in sixteen, so that it will not deliver one clock pulse too many or too few during the reference pattern period.

Given the above, it is possible to define that the tuned circuit 24 is "in tune" when the clock falling edges 33 occur between lines $t_1$ and $(t_1 + t_2)$ with reference to the beginning of the bit cell t as shown in FIG. 4. In other words, the falling edges 33 must not be outside the dotted boundaries shown, which are on either side of the centre $t/2$ of the bit cell t, $t'/2$. $t_2$ therefore represents the upper limit for the tuned circuit 24 to be "out of tune", and is determined by worst case conditions in terms of transmit clock accuracy, transmission line jitter and the like considerations known to those skilled in the art.

Now the operation of the circuit in FIG. 3 will be described. As the system clock and the frame sync pulses are applied to the counter 26, it counts the frame bits. The decoder 27 decodes the state of the counter 26 to produce a pulse STM every alternate channel which starts the mono-stable 28 to generate the first timing pulse CK1 corresponding to $t_1$ and which starts the mono-stable 29 to generate a second timing pulse CK2 corresponding to $t_2$. The pulses CK1 and CK2 clock the flip-flops 30 and 31, respectively. For the purpose of explanation, let us assume that the recovered clock RCK is in proper phase because the tuned circuit 24 is "in tune". This means that consistently the J terminal of the flip-flop 30 will be high (a logical one) during $t_1$; the flip-flop 31, on the other hand, is held "reset" during $t_2$ and its Q output is low (logical zero), and will always be low provided the decoder 27 delivers to the reset terminal RS of the flip-flop 31 a reset pulse at the beginning of every frame by decoding the all zeros state of the counter 26.

Assuming now that the recovered clock RCK is not in proper phase because the tuned circuit 24 is sufficiently "out of tune". The recovered clock RCK will either go low at some instant during $t_1$ or remain high at the end of $t_2$. In the first case the flip-flop 30 will remain reset and prevent the J terminal of the flip-flop 31 from being low. In the second case, the other input of the NAND gate 32 will be low at the time of pulse CK 2, and the same result ensues. In either case the Q output of the flip-flop 31 will go high (logical one) thus giving a decision that the clock RCK is not in phase and that the tuned circuit 24 is sufficiently out of tune (with the transmit clock, or 1.544 MHz). The Q output of the flip-flop 31 (the decision output) is applied to the control logic 25 (in FIG. 5) and should preferably be sensed just prior to the occurrence of the reset pulse RSR, i.e. just before the end of a frame, so that if it is low the tuning operation is discontinued and the equipment is returned to normal operation.

Figure 5:
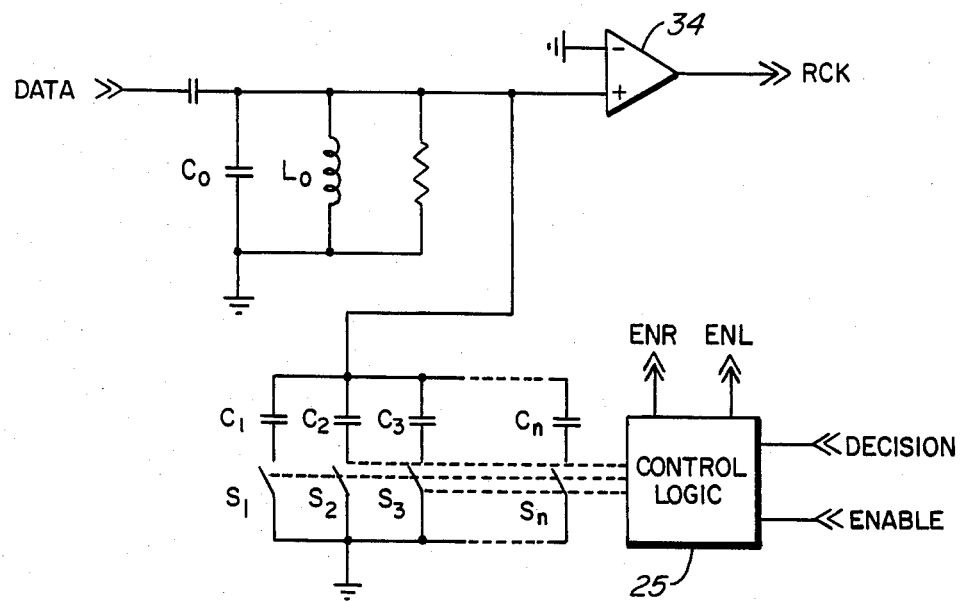
FIG. 5 is a more detailed circuit of a block in the circuit shown in FIG. 2.

Turning now to FIG. 5 of the drawings, the tuned circuit 24 comprises a conventional parallel tank circuit of a capacitor $C_0$ and an inductor $L_0$ connected to the amplifier 34. So far this is a conventional tuned circuit and its resonant or normal frequency would be $(L_0C_0)^{-\frac{1}{2}}$. This resonant frequency would decrease if any of an additional array of parallel capacitors $C_1$, $C_2$–$C_n$ were switched in the circuit by a respective one of the switches $S_1$, $S_2$–$S_n$ being closed. The number of capacitors $C_j$ required, i.e. n, would depend on the tolerance on the value of the components $C_0$ and $L_0$. The larger the tolerance, the larger must n be. It is preferred to make $C_{(j+1)}=2C_j$ and the value of $C_1$ would depend on the tuning resolution required, which in turn depends from the timing differential period $t_2$ (in FIG. 4). Switching one capacitor $C_j$ in or out of the circuit would cause the RCK clock falling edges to change occurrence by an increment less than the differential period $t_2$.

The number of capacitors $C_j$ connected in the circuit, i.e. the number j of switches $S_j$ closed, is controlled by the control logic 25. The switched capacitor technology is sufficiently advanced to permit an integrated realization of the capacitors $C_j$ and associated switches $S_j$. The switches $S_j$ may then be controlled by software means if available. Alternatively, the switches $S_j$ may be directly controlled by the binary stages of a binary counter which is clocked by the frame pulse or every alternate channel and which stops counting and holds its value as the decision lead (being the Q output of the flip-flop 31) goes low (logic zero). The value in the counter times $C_1$ then equals the total capacitance added in the circuit. The control logic 25 is enabled by a request to commence the tuning process and in turn will switch the MUX 16 to put the reference pattern from the generator 21 through the transmit section 14 by means of the ENR lead, while simultaneously switching the MUX 13 by means of the ENL lead to loop around the transmit signal to the receive amplifier 11 and to the receive section 10 as well as to the adaptive tuned circuit 20. The control logic 25 then senses the decision lead and if it is high the tuning process commences until the decision lead goes low.

What is claimed is:

1. An adaptively tuned clock recovery circuit for recovering a clock signal from an incoming digital data stream comprising:
    a pattern generator for supplying a periodic reference data pattern at a local clock rate;
    a tunable resonant circuit having an initial resonant frequency in the vicinity of the local clock rate and excited by said reference data pattern, said tunable resonant circuit comprising an array of capacitors $C_1$–$C_j$–$C_n$, where $C_{(j+1)}=2C_j$ and $C_1$ has a predetermined value;
    a bistable phase discriminator for indicating that a predetermined phase-difference between said local clock rate and free oscillations of said tunable resonant circuit has been exceeded; and
    control means responsive to said bistable phase discriminator for varying said initial resonant frequency toward said local clock rate until said predetermined phase-difference is no longer being exceeded.

2. The circuit as defined in claim 1, said reference data pattern comprising two consecutive "ones" followed by fourteen "zeros".

3. The circuit as defined in claim 1, each capacitor in said array of capacitors switchable into said tuned circuit by a corresponding switch in an array of switches $S_1$–$S_j$–$S_n$.

4. The circuit as defined in claim 3, each switch in said array of switches controlled by a corresponding stage in said control means.

5. The circuit as defined in claim 1, said bistable phase discriminator comprising first and second timing circuits for generating first and second timing signals flanking centres of "ones" in said periodic reference data pattern, and two flip-flops responsive to a clock signal recovered from the reference pattern and to said first and second timing signals for indicating occurrence of said clock signal outside said first and second timing signals.

6. The circuit as defined in claim 2, said bistable phase discriminator comprising first and second timing circuits for generating first and second timing signals flanking centres of "ones" in said periodic reference data pattern, and two flip-flops responsive to a clock signal recovered from the reference pattern and to said first and second timing signals for indicating occurrence of said clock signal outside said first and second timing signals.

7. The circuit as defined in claim 3, said bistable phase discriminator comprising first and second timing circuits for generating first and second timing signals flanking centres of "ones" in said periodic reference data pattern, and two flip-flops responsive to a clock signal recovered from the reference pattern and to said first and second timing signals for indicating occurrence of said clock signal outside said first and second timing signals.

8. The circuit as defined in claim 4, said bistable phase discriminator comprising first and second timing circuits for generating first and second timing signals flanking centres of "ones" in said periodic reference data pattern, and two flip-flops responsive to a clock signal recovered from the reference pattern and to said first and second timing signals for indicating occurrence of said clock signal outside said first and second timing signals.

9. The circuit as defined in claim 1, said bistable phase discriminator comprising first and second timing circuits driven by a stable system clock for generating first and second timing signals flanking centres of "ones" in said periodic reference data pattern, and two flip-flops responsive to a clock signal recovered from the reference pattern and to said first and second timing signals for indicating occurrence of said clock signal outside said first and second timing signals.

10. The circuit as defined in claim 2, said bistable phase discriminator comprising first and second timing circuits driven by a stable system clock for generating first and second timing signals flanking centres of "ones" in said periodic reference data pattern, and two flip-flops responsive to a clock signal recovered from the reference pattern and to said first and second timing signals for indicating occurrence of said clock signal outside said first and second timing signals.

11. The circuit as defined in claim 3, said bistable phase discriminator comprising first and second timing circuits driven by a stable system clock for generating first and second timing signals flanking centres of "ones" in said periodic reference data pattern, and two flip-flops responsive to a clock signal recovered from the reference pattern and to said first and second timing signals for indicating occurrence of said clock signal outside said first and second timing signals.

12. The circuit as defined in claim 4, said bistable phase discriminator comprising first and second timing circuits driven by a stable system clock for generating first and second timing signals flanking centres of "ones" in said periodic reference data pattern, and two flip-flops responsive to a clock signal recovered from the reference pattern and to said first and second timing signals for indicating occurrence of said clock signal outside said first and second timing signals.

13. The circuit as defined in claim 3, said bistable phase discriminator comprising first and second timing circuits driven by a stable system clock for generating first and second timing signals flanking centres of "ones" in said periodic reference data pattern, and two flip-flops responsive to a clock signal recovered from the reference pattern and to said first and second timing signals for indicating occurrence of said clock signal outside said first and second timing signals, and said reference data pattern comprising two consecutive "ones" followed by fourteen "zeros".

14. The circuit as defined in claim 4, said bistable phase discriminator comprising first and second timing circuits driven by a stable system clock for generating first and second timing signals flanking centres of "ones" in said periodic reference data pattern, and two flip-flops responsive to a clock signal recovered from the reference pattern and to said first and second timing signals for indicating occurrence of said clock signal outside said first and second timing signals, and said reference data pattern comprising two consecutive "ones" followed by fourteen "zeros".

* * * * *